United States Patent
Yi (10) Patent No.: US 9,337,219 B1
(45) Date of Patent: May 10, 2016

(54) METHOD FOR MANUFACTURING FLEXIBLE DISPLAY DEVICE (71) Applicant: Shenzhen China Star Optoelectronics Technology Co., Ltd., Shenzhen, Guangdong (CN)

(72) Inventor: Zhigen Yi, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/420,645

(22) PCT Filed: Dec. 5, 2014

(86) PCT No.: PCT/CN2014/093162
§ 371 (c)(1),
(2) Date: Feb. 9, 2015

(30) Foreign Application Priority Data

Nov. 18, 2014 (CN) .......................... 2014 1 0658898

(51) Int. Cl.
*H01L 21/84* (2006.01)
*H01L 27/12* (2006.01)
*B32B 37/12* (2006.01)
*B32B 43/00* (2006.01)

(52) U.S. Cl.
CPC ............ *H01L 27/1266* (2013.01); *B32B 37/12* (2013.01); *B32B 43/006* (2013.01); *H01L 27/1218* (2013.01); *B32B 2307/422* (2013.01); *B32B 2457/20* (2013.01)

(58) Field of Classification Search
CPC . H01L 27/1266; H01L 27/1218; B32B 37/12; B32B 43/006
See application file for complete search history.

(56) References Cited

U.S. PATENT DOCUMENTS

| | | | |
|---|---|---|---|
| 7,170,841 B2* | 1/2007 | Shoji .................. | G11B 7/00736 369/275.3 |
| 7,605,026 B1* | 10/2009 | Shieh .................. | H01L 29/7869 257/346 |
| 2005/0274952 A1* | 12/2005 | Yamazaki ......... | H01L 21/26586 257/66 |
| 2007/0178672 A1* | 8/2007 | Tanaka ............... | B23K 26/0736 438/487 |

* cited by examiner

Primary Examiner — Richard Booth
(74) Attorney, Agent, or Firm — Andrew C. Cheng (57) ABSTRACT

Disclosed is a method for manufacturing a flexible display device. The method includes: providing a substrate, the substrate having a first surface and the second surface opposite to each other; forming a first flexible substrate on the first surface of the substrate and forming the second flexible substrate on the second surface of the substrate in such a way that a force acting from the first flexible substrate to the substrate is equal to, but in opposite direction, a force acting from the second substrate to the substrate; forming a displaying component on a surface of the first flexible substrate that is distant from the substrate; and peeling the first flexible substrate on which the displaying component is formed off the substrate so as to form a flexible display device. The flexible display device manufactured with the method has an enhanced quality.

10 Claims, 6 Drawing Sheets

METHOD FOR MANUFACTURING FLEXIBLE DISPLAY DEVICE

CROSS REFERENCE TO RELATED APPLICATIONS

This application claims the priority of Chinese Patent Application No. 201410658898.1, entitled "Method for Manufacturing Flexible Display Device", filed on Nov. 18, 2014, the disclosure of which is incorporated herein by reference in its entirety.

BACKGROUND OF THE INVENTION

1. Field of the Invention

The present invention relates to the field of display, and in particular to a method for manufacturing a flexible display device.

2. The Related Arts

With the progress of science and technology, flexible displaying techniques have been advanced very quickly. A known method for manufacturing a flexible display device is generally forming a very thin plastic substrate on a surface of a glass substrate and forming components, such as flexible displaying components, on the plastic substrate. The plastic substrate with the flexible displaying components formed thereon is then peeled off the glass substrate to form a flexible display device. However, formation of the components, such as flexible displaying components, requires a high temperature process. Due to the fact that the plastic substrate and the glass substrate have different extents of thermal expansion, edges of the plastic substrate may get warped thereby causing poor quality of the flexible display device.

SUMMARY OF THE INVENTION

In an aspect, the present invention provides a method for manufacturing a flexible display device.

The method for manufacturing a flexible display device comprises:

providing a substrate, wherein the substrate comprises a first surface and a second surface that are opposite to each other;

forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate;

forming a displaying component on a surface of the first flexible substrate that is distant from the substrate; and peeling the first flexible substrate on which the displaying component is formed off the substrate so as to form a flexible display device.

After the step of "peeling the first flexible substrate on which the displaying component is formed off the substrate so as to form a flexible display device", the method for manufacturing the flexible display device further comprises:

forming a first flexible substrate on the first surface of the substrate;

forming a displaying component on a surface of the first flexible substrate that is distant from the substrate; and peeling the first flexible substrate on which the displaying component is formed off the substrate so as to form a flexible display device.

In the step of "forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate", adhesive is applied to bond the first flexible substrate to the first surface of the substrate and adhesive is applied to bond the second flexible substrate to the second surface of the substrate.

In the step of "forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate", the atmospheric pressure is used to set the first flexible substrate on the first surface of the substrate and the atmospheric pressure is used to set the second flexible substrate on the second surface of the substrate.

The method for manufacturing the flexible display device further comprises:

forming a driving circuit of the displaying component on the surface of the first flexible substrate that is distant from the substrate.

In the second aspect, the present invention provides a method for manufacturing a flexible display device. The method for manufacturing a flexible display device comprises:

providing a substrate, wherein the substrate comprises a first surface and a second surface that are opposite to each other;

forming a first flexible substrate on the first surface of the substrate and forming the second flexible substrate on the second surface of the substrate, wherein the first flexible substrate and the second flexible substrate are made of the same material to have the same size;

forming a displaying component on a surface of the first flexible substrate that is distant from the substrate; and peeling the first flexible substrate on which the displaying component is formed off the substrate so as to form a flexible display device.

After the step of "peeling the first flexible substrate on which the displaying component is formed off the substrate so as to form a flexible display device", the method for manufacturing the flexible display device further comprises:

forming a first flexible substrate on the first surface of the substrate;

forming a displaying component on a surface of the first flexible substrate that is distant from the substrate; and peeling the first flexible substrate on which the displaying component is formed off the substrate so as to form a flexible display device.

In the step of "forming a first flexible substrate on the first surface of the substrate and forming the second flexible substrate on the second surface of the substrate, wherein the first flexible substrate and the second flexible substrate are made of the same material to have the same size", adhesive is applied to bond the first flexible substrate to the first surface of the substrate and adhesive is applied to bond the second flexible substrate to the second surface of the substrate.

In the step of "forming a first flexible substrate on the first surface of the substrate and forming the second flexible substrate on the second surface of the substrate, wherein the first flexible substrate and the second flexible substrate are made of the same material to have the same size", the atmospheric pressure is used to set the first flexible substrate on the first surface of the substrate and the atmospheric pressure is used to set the second flexible substrate on the second surface of the substrate.

The method for manufacturing the flexible display device further comprises:

forming a driving circuit of the displaying component on the surface of the first flexible substrate that is distant from the substrate.

In each of the methods for manufacturing a flexible display device described in each of the above embodiments, when the first flexible substrate and the second flexible substrate are subjected to heating, since the amount of contraction of the first flexible substrate is greater than the amount of contraction of the glass substrate, the first flexible substrate applies an acting force to the glass substrate, which will be referred to as a first acting force. Under the action of the first acting force, the first flexible substrate forces the glass substrate to contract upward. However, since the second flexible substrate is formed on the second surface of the substrate, when the second flexible substrate is subjected to heating, due to the amount of contraction of the second flexible substrate being greater than the amount of contraction of the glass substrate, the second flexible substrate applied an acting force to the glass substrate, which will be referred to as a second acting force. Under the action of the second acting force, the second flexible substrate forces the glass substrate to contract downward. Since the first acting force and the second acting force are equal in amount but opposite in direction, the first acting force and the second acting force cancel each other thereby preventing the first flexible substrate, the second flexible substrate, and the substrate from getting warped and thus enhancing the quality of a flexible display device.

BRIEF DESCRIPTION OF THE DRAWINGS

To more clearly explain the technical solutions proposed in embodiments of the present invention or those of the prior art, a brief description of the drawings that are necessary for describing the embodiments of the present invention or the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
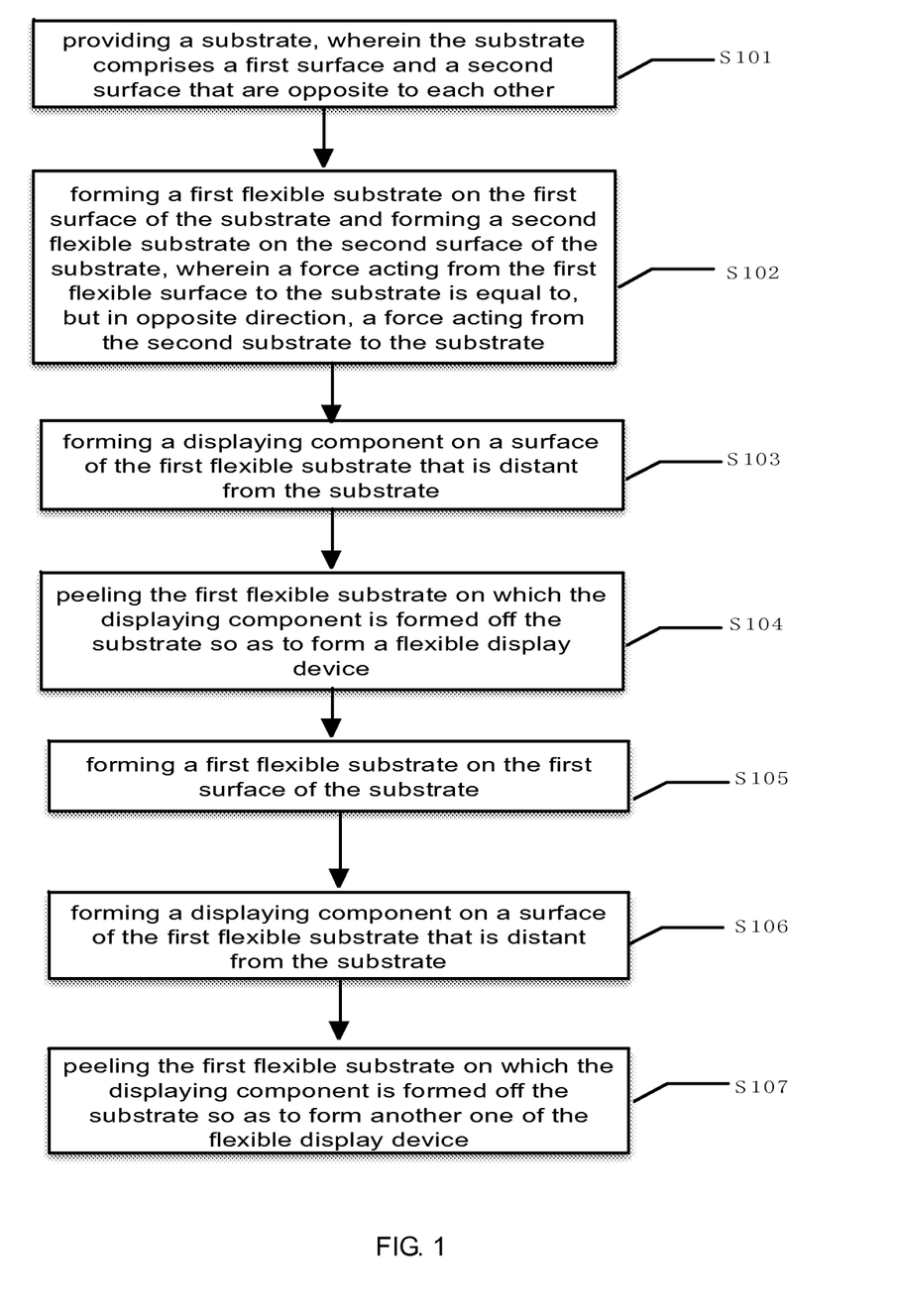
FIG. 1 is a flow chart illustrating a method for manufacturing a flexible display device according to a first preferred embodiment of the present invention.

Referring to FIG. 1, which is a flow chart illustrating a method for manufacturing a flexible display device according to a first preferred embodiment of the present invention, the method for manufacturing a flexible display device 10 comprises, but is not limited to, the following steps.

Figure 2:
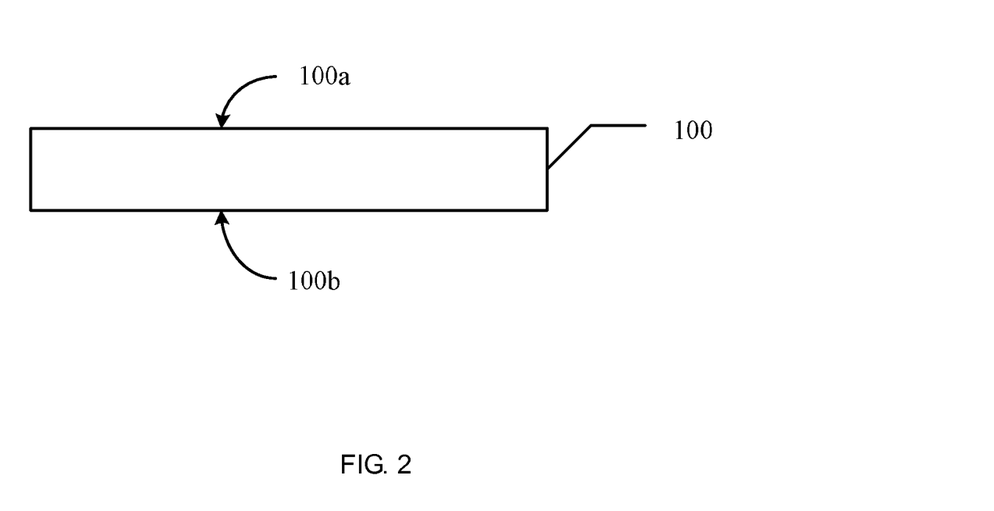
FIGS. 2-9 are schematic views illustrating various steps of the method for manufacturing a flexible display device according to the first embodiment of the present invention.

Step S101: providing a substrate 100, wherein the substrate 100 comprises a first surface 100a and a second surface 100b that are opposite to each other. Referring additionally to FIG. 2, the substrate 100 can be a glass substrate, and the glass substrate can be an ultrathin glass substrate. The glass substrate has a thickness less than or equal to 0.1 mm.

Figure 3:
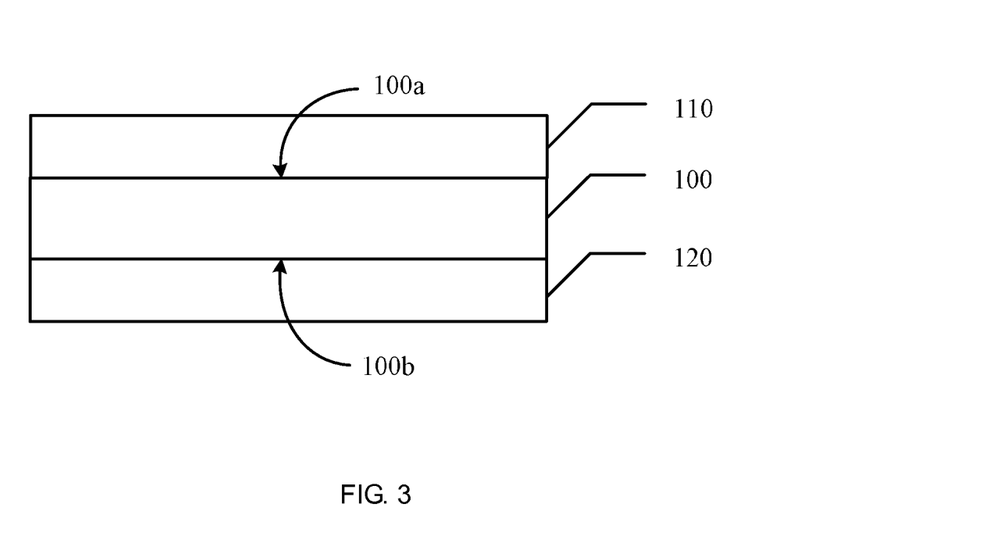

Step S102: forming a first flexible substrate 110 on the first surface 100a of the substrate 100 and forming the second flexible substrate 120 on the second surface 100b of the substrate 100, wherein a force acting from the first flexible substrate 110 to the substrate 100 is equal to, but in opposite direction, a force acting from the second substrate 120 to the substrate 100.

Referring additionally to FIG. 3, the first flexible substrate 110 and the second flexible substrate 120 are respectively formed on the first surface 100a and the second surface 100b of the substrate 100. In the instant embodiment, the first flexible substrate 110 and the second flexible substrate 120 are both plastic substrates and the materials of the plastic substrates comprise one of polycarbonate, polyethylene terephthalate, polyimide, polyarylate, polyethersulfone, polyethylene naphthalate, and fiber reinforced plastics, or combinations of two or more than two of them.

An acting force applied from the first flexible substrate 110 to the substrate 100 is equal to, but in opposite direction, an acting force applied from the second substrate 120 to the substrate 100. When the first flexible substrate 110 and the second flexible substrate 120 are subjected to heating, since the amount of contraction of the first flexible substrate 110 is greater than the amount of contraction of the glass substrate, the first flexible substrate 110 applies an acting force to the glass substrate, which will be referred to as a first acting force. Under the action of the first acting force, the first flexible substrate 110 forces the glass substrate to contract upward. However, since the second flexible substrate 120 is formed on the second surface 100b of the substrate 100, when the second flexible substrate 120 is subjected to heating, due to the amount of contraction of the second flexible substrate 110 being greater than the amount of contraction of the glass substrate, the second flexible substrate 120 applied an acting force to the glass substrate, which will be referred to as a second acting force. Under the action of the second acting force, the second flexible substrate forces the glass substrate to contract downward. Since the first acting force and the second acting force are equal in amount but opposite in direction, the first acting force and the second acting force cancel each other thereby preventing the first flexible substrate 110, the second flexible substrate 120, and the substrate 100 from getting warped and thus enhancing the quality of a flexible display device.

In one embodiment, in Step S102, adhesive is applied to bond the first flexible substrate 110 to the first surface 100a of the substrate 100 and adhesive is applied to bond the second flexible substrate 120 to the second surface 110b of the substrate 100.

In another embodiment, in Step S102, the atmospheric pressure is used to set the first flexible substrate 110 on the first surface 100a of the substrate 100 and the atmospheric pressure is used to set the second flexible substrate 120 on the second surface 100b of the substrate 100.

Figure 4:
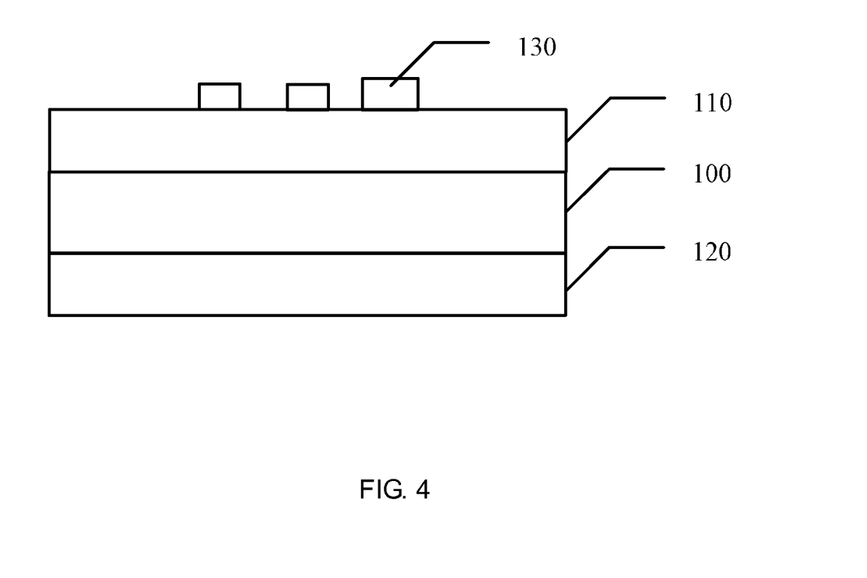

Step S103: forming a displaying component 130 on a surface of the first flexible substrate 110 that is distant from the substrate 100. Referring additionally to FIG. 4, the first flexible substrate 110 comprises two opposite surfaces and the first flexible substrate 110 is formed through one of these surfaces on the first surface 100a of the substrate 100, and the other surface of the first flexible substrate 100 is used to receive the displaying component 130 formed thereon. The displaying component can be one of a liquid crystal display, an organic electroluminescent display, an electronic paper, an electrophoretic display, a touch screen, and a thin-film photovoltaic cell or a combination of two or more than two of them.

Figure 5:
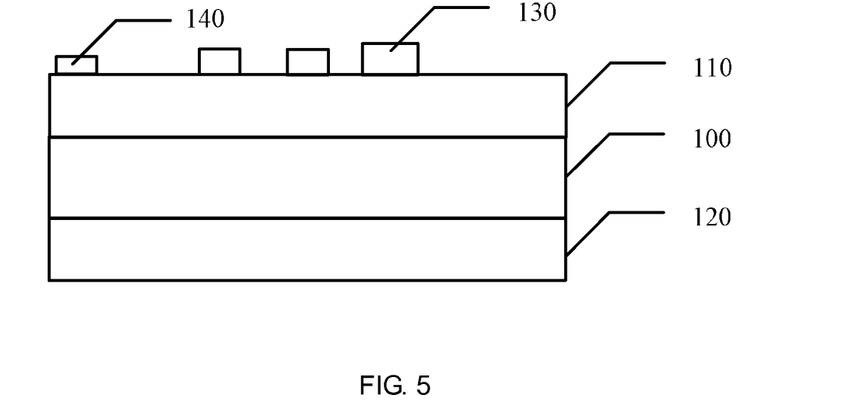

Preferably, after Step S103, the method for manufacturing the flexible display device 10 further comprises: forming a driving circuit 140 of the displaying component 130 on the surface of the first flexible substrate 110 that is distant from the substrate 100. Referring additionally to FIG. 5, the driving circuit 140 is provided to drive the displaying component 130. It is appreciated that, in other embodiments, forming the driving circuit 140 of the displaying component 130 formed on the surface of the first flexible substrate 110 that is distant from the substrate 100 can be performed in the same step as that of forming the displaying component 130 on the surface of the first flexible substrate 110 that is distant from the substrate 100.

Figure 6:
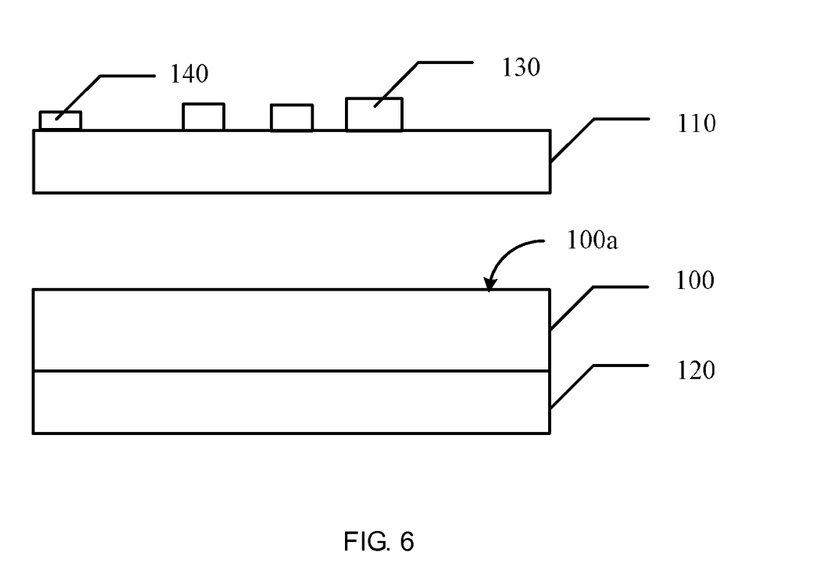

Step S104: peeling the first flexible substrate 110 on which the displaying component 130 is formed off the substrate 100 so as to form a flexible display device 10. Referring additionally to FIG. 6, the first flexible substrate 110 on which the displaying component 130 is formed is peeled from the first surface 100a of the substrate 100 so that the first flexible substrate 100 and the displaying component 130 formed on the surface of the first flexible substrate 100 collectively form the flexible display device 10.

Figure 7:
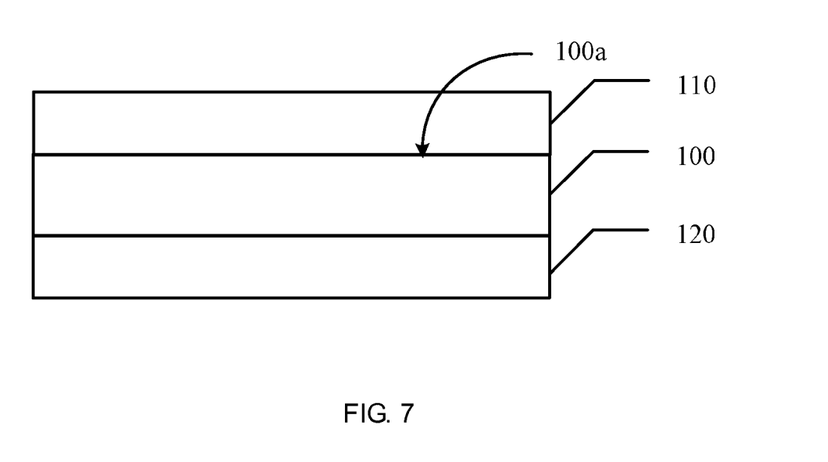

Step S105: forming a first flexible substrate 110 on the first surface 100a of the substrate 100. Referring additionally to FIG. 7, a first flexible substrate 110 is formed again on the first surface 100a of the substrate 100.

Figure 8:
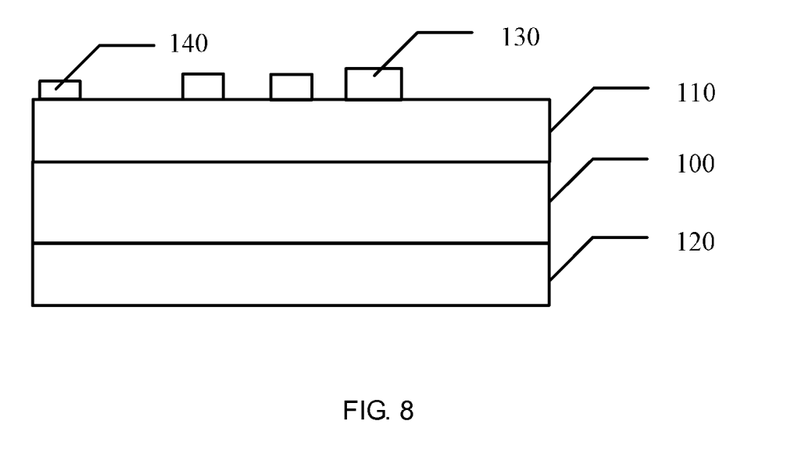

Step S106: forming a displaying component 130 on a surface of the first flexible substrate 110 that is distant from the substrate 100. Referring additionally to FIG. 8, the first flexible substrate 110 comprises two opposite surfaces and the first flexible substrate 110 is formed through one of these surfaces on the first surface 100a of the substrate 100, and the other surface of the first flexible substrate 100 is used to receive the displaying component 130 formed thereon. The displaying component can be one of a liquid crystal display, an organic electroluminescent display, an electronic paper, an electrophoretic display, a touch screen, and a thin-film photovoltaic cell or a combination of two or more than two of them.

Preferably, after Step S106, the method for manufacturing the flexible display device 10 further comprises: forming a driving circuit 140 of the displaying component 130 on the surface of the first flexible substrate 110 that is distant from the substrate 100. The driving circuit 140 is provided to drive the displaying component 130. It is appreciated that, in other embodiments, forming the driving circuit 140 of the displaying component 130 formed on the surface of the first flexible substrate 110 that is distant from the substrate 100 can be performed in the same step as that of forming the displaying component 130 on the surface of the first flexible substrate 110 that is distant from the substrate 100.

Figure 9:
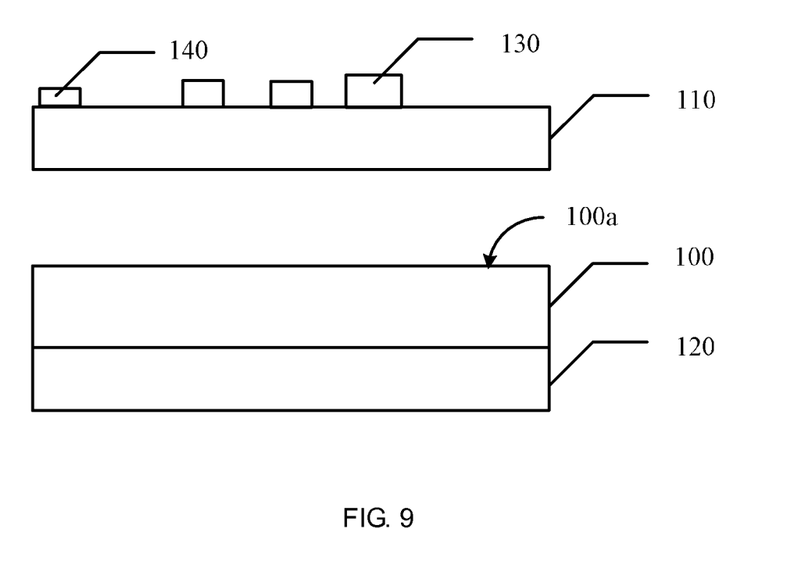

Step S107: peeling the first flexible substrate 110 on which the displaying component 130 is formed off the substrate 100 so as to form another one of the flexible display device 10. Referring additionally to FIG. 9, the first flexible substrate 110 on which the displaying component 130 is formed is peeled from the first surface 100a of the substrate 100 so that the first flexible substrate 100 and the displaying component 130 formed on the surface of the first flexible substrate 100 collectively form the flexible display device 10.

After Step S104, Steps S105-S107 are repeatedly performed so as to repeatedly use the substrate 10 of which the second surface 110b comprises the second flexible substrate 120 formed thereon to generate multiple ones of the flexible display device 10.

Figure 10:
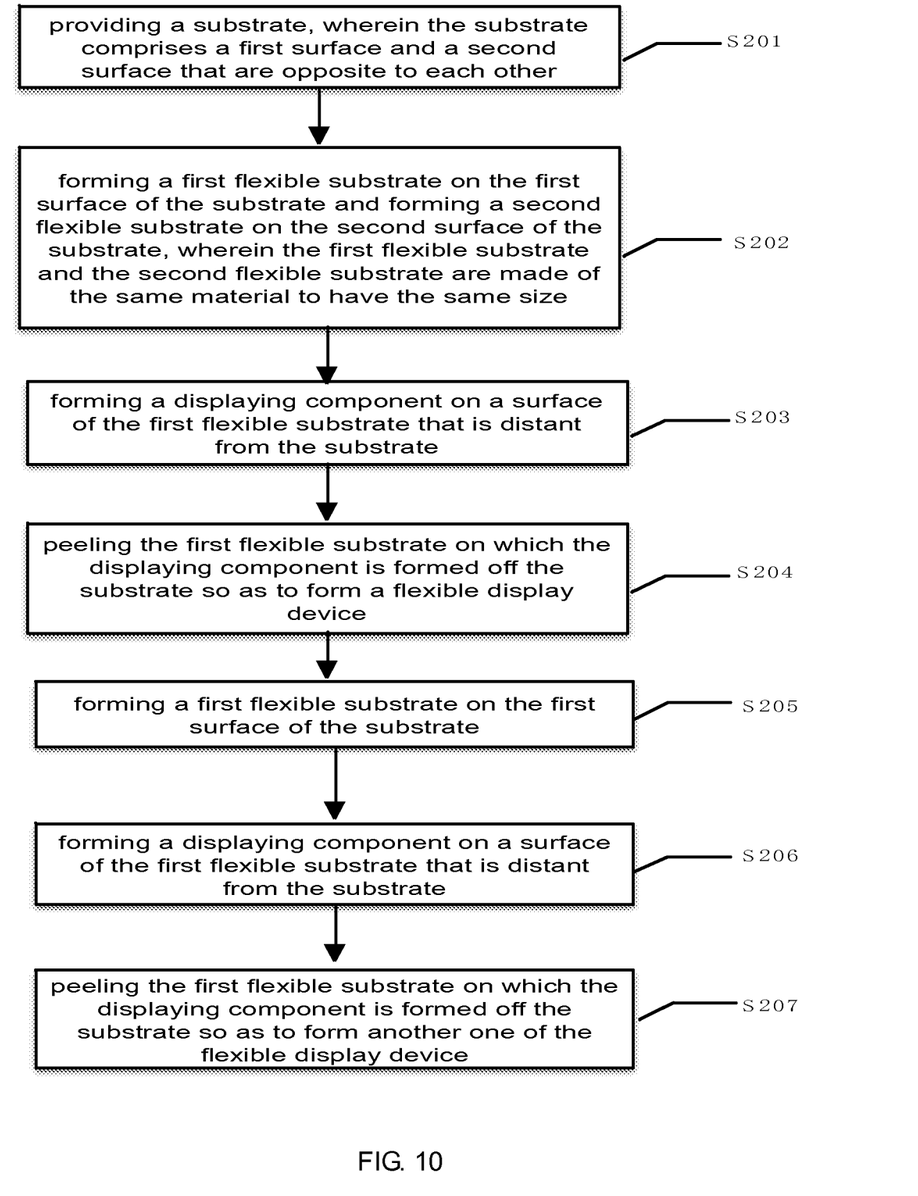
FIG. 10 is a flow chart illustrating a method for manufacturing a flexible display device according to a second preferred embodiment of the present invention.

Referring to FIG. 10, which is a flow chart illustrating a method for manufacturing a flexible display device according to a second preferred embodiment of the present invention, the method for manufacturing a flexible display device 10 comprises, but is not limited to, the following steps.

Step S201: providing a substrate 100, wherein the substrate comprises a first surface 100a and a second surface 100b that are opposite to each other. Referring additionally to FIG. 2, the substrate 100 can be a glass substrate, and the glass substrate can be a ultrathin glass substrate. The glass substrate has a thickness less than or equal to 0.1 mm.

Step S202: forming a first flexible substrate 110 on the first surface 100a of the substrate 100 and forming the second flexible substrate 120 on the second surface 100b of the substrate 100, wherein the first flexible substrate 110 and the second flexible substrate 120 are made of the same material to have the same size. Specifically, the first flexible substrate 110 and the second flexible substrate 120 are of the same material and the same size. The sizes of the first flexible substrate 110 and the second flexible substrate 120 are identical and have the same thickness, the same shape, the same length, and the same width.

Referring additionally to FIG. 3, the first flexible substrate 110 and the second flexible substrate 120 are respectively formed on the first surface 100a and the second surface 100b of the substrate 100. In the instant embodiment, the first flexible substrate 110 and the second flexible substrate 120 are both plastic substrates and the materials of the plastic substrates comprise one of polycarbonate, polyethylene terephthalate, polyimide, polyarylate, polyethersulfone, polyethylene naphthalate, and fiber reinforced plastics, or combinations of two or more than two of them.

Since the first flexible substrate 110 and the second flexible substrate 120 are of the same material and the same size, an acting force applied from the first flexible substrate 110 to the substrate 100 is equal to, but in opposite direction, an acting force applied from the second substrate 120 to the substrate 100.

When the first flexible substrate 110 and the second flexible substrate 120 are subjected to heating, since the amount of contraction of the first flexible substrate 110 is greater than the amount of contraction of the glass substrate, the first flexible substrate 110 applies an acting force to the glass substrate, which will be referred to as a first acting force. Under the action of the first acting force, the first flexible substrate 110 forces the glass substrate to contract upward. However, since the second flexible substrate 120 is formed on the second surface 100b of the substrate 100, when the second flexible substrate 120 is subjected to heating, due to the amount of contraction of the second flexible substrate 110 being greater than the amount of contraction of the glass substrate, the second flexible substrate 120 applied an acting force to the glass substrate, which will be referred to as a second acting force. Under the action of the second acting force, the second flexible substrate forces the glass substrate to contract downward. Since the first acting force and the second acting force are equal in amount but opposite in direction, the first acting force and the second acting force cancel each other thereby preventing the first flexible substrate 110, the second flexible substrate 120, and the substrate 100 from getting warped and thus enhancing the quality of a flexible display device.

In one embodiment, in Step S202, adhesive is applied to bond the first flexible substrate 110 to the first surface 100a of the substrate 100 and adhesive is applied to bond the second flexible substrate 120 to the second surface 110b of the substrate 100.

In another embodiment, in Step S202, the atmospheric pressure is used to set the first flexible substrate 110 on the first surface 100a of the substrate 100 and the atmospheric pressure is used to set the second flexible substrate 120 on the second surface 100b of the substrate 100.

Step S203: forming a displaying component 130 on a surface of the first flexible substrate 110 that is distant from the substrate 100.

Preferably, after Step S203, the method for manufacturing the flexible display device 10 further comprises: forming a driving circuit 140 of the displaying component 130 on the surface of the first flexible substrate 110 that is distant from the substrate 100. Referring additionally to FIG. 5, the driving circuit 140 is provided to drive the displaying component 130. It is appreciated that, in other embodiments, forming the driving circuit 140 of the displaying component 130 formed on the surface of the first flexible substrate 110 that is distant from the substrate 100 can be performed in the same step as that of forming the displaying component 130 on the surface of the first flexible substrate 110 that is distant from the substrate 100.

Step S204: peeling the first flexible substrate 110 on which the displaying component 130 is formed off the substrate 100 so as to form a flexible display device 10. Referring additionally to FIG. 6, the first flexible substrate 110 on which the displaying component 130 is formed is peeled from the first surface 100a of the substrate 100 so that the first flexible substrate 100 and the displaying component 130 formed on the surface of the first flexible substrate 100 collectively form the flexible display device 10.

Step S205: forming a first flexible substrate 110 on the first surface 100a of the substrate 100. Referring additionally to FIG. 7, a first flexible substrate 110 is formed again on the first surface 100a of the substrate 100.

Step S206: forming a displaying component 130 on a surface of the first flexible substrate 110 that is distant from the substrate 100. Referring additionally to FIG. 8, the first flexible substrate 110 comprises two opposite surfaces and the first flexible substrate 110 is formed through one of these surfaces on the first surface 100a of the substrate 100, and the other surface of the first flexible substrate 100 is used to receive the displaying component 130 formed thereon. The displaying component can be one of a liquid crystal display, an organic electroluminescent display, an electronic paper, an electrophoretic display, a touch screen, and a thin-film photovoltaic cell or a combination of two or more than two of them.

Preferably, after Step S206, the method for manufacturing the flexible display device 10 further comprises: forming a driving circuit 140 of the displaying component 130 on the surface of the first flexible substrate 110 that is distant from the substrate 100. The driving circuit 140 is provided to drive the displaying component 130. It is appreciated that, in other embodiments, forming the driving circuit 140 of the displaying component 130 formed on the surface of the first flexible substrate 110 that is distant from the substrate 100 can be performed in the same step as that of forming the displaying component 130 on the surface of the first flexible substrate 110 that is distant from the substrate 100.

Step S207: peeling the first flexible substrate 110 on which the displaying component 130 is formed off the substrate 100 so as to form another one of the flexible display device 10. Referring additionally to FIG. 9, the first flexible substrate 110 on which the displaying component 130 is formed is peeled from the first surface 100a of the substrate 100 so that the first flexible substrate 100 and the displaying component 130 formed on the surface of the first flexible substrate 100 collectively form the flexible display device 10.

After Step S204, Steps S205-S207 are repeatedly performed so as to repeatedly use the substrate 10 of which the second surface 110b comprises the second flexible substrate 120 formed thereon to generate multiple ones of the flexible display device 10.

Disclosed above is only one preferred embodiment of the present invention, which does not impose undue constraints to the scope of protection of the present invention. Those having ordinary skills of the art may readily appreciate that equivalent modifications that allow for realization of all or part of the operation process of the preferred embodiment described above and comply with the requirement defined in the appended claims are considered within the protection scope covered by the present invention.

What is claimed is:

1. A method for manufacturing a flexible display device, comprising:
   providing a substrate, wherein the substrate comprises a first surface and a second surface that are opposite to each other;
   forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate;
   forming a displaying component on a surface of the first flexible substrate that is distant from the substrate; and
   peeling the first flexible substrate on which the displaying component is formed off the substrate so as to form a flexible display device.

2. The method for manufacturing the flexible display device as claimed in claim 1, wherein after the step of "peeling the first flexible substrate on which the displaying component is formed off the substrate so as to form a flexible display device", the method for manufacturing the flexible display device further comprises:
   forming a first flexible substrate on the first surface of the substrate;
   forming a displaying component on a surface of the first flexible substrate that is distant from the substrate; and
   peeling the first flexible substrate on which the displaying component is formed off the substrate so as to form a flexible display device.

3. The method for manufacturing the flexible display device as claimed in claim 1, wherein in the step of "forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate", adhesive is applied to bond the first flexible substrate to the first surface of the substrate and adhesive is applied to bond the second flexible substrate to the second surface of the substrate.

4. The method for manufacturing the flexible display device as claimed in claim 1, wherein in the step of "forming a first flexible substrate on the first surface of the substrate and forming the second flexible substrate on the second surface of the substrate, wherein a force acting from the first flexible substrate to the substrate is equal to, but in opposite direction, a force acting from the second substrate to the substrate", the atmospheric pressure is used to set the first flexible substrate on the first surface of the substrate and the atmospheric pressure is used to set the second flexible substrate on the second surface of the substrate.

5. The method for manufacturing the flexible display device as claimed in claim 1, wherein the method for manufacturing the flexible display device further comprises:

forming a driving circuit of the displaying component on the surface of the first flexible substrate that is distant from the substrate.

6. A method for manufacturing a flexible display device, comprising:

providing a substrate, wherein the substrate comprises a first surface and a second surface that are opposite to each other;

forming a first flexible substrate on the first surface of the substrate and forming the second flexible substrate on the second surface of the substrate, wherein the first flexible substrate and the second flexible substrate are made of the same material to have the same size;

forming a displaying component on a surface of the first flexible substrate that is distant from the substrate; and peeling the first flexible substrate on which the displaying component is formed off the substrate so as to form a flexible display device.

7. The method for manufacturing the flexible display device as claimed in claim 6, wherein after the step of "peeling the first flexible substrate on which the displaying component is formed off the substrate so as to form a flexible display device", the method for manufacturing the flexible display device further comprises:

forming a first flexible substrate on the first surface of the substrate;

forming a displaying component on a surface of the first flexible substrate that is distant from the substrate; and peeling the first flexible substrate on which the displaying component is formed off the substrate so as to form a flexible display device.

8. The method for manufacturing the flexible display device as claimed in claim 6, wherein in the step of "forming a first flexible substrate on the first surface of the substrate and forming the second flexible substrate on the second surface of the substrate, wherein the first flexible substrate and the second flexible substrate are made of the same material to have the same size", adhesive is applied to bond the first flexible substrate to the first surface of the substrate and adhesive is applied to bond the second flexible substrate to the second surface of the substrate.

9. The method for manufacturing the flexible display device as claimed in claim 6, wherein in the step of "forming a first flexible substrate on the first surface of the substrate and forming the second flexible substrate on the second surface of the substrate, wherein the first flexible substrate and the second flexible substrate are made of the same material to have the same size", the atmospheric pressure is used to set the first flexible substrate on the first surface of the substrate and the atmospheric pressure is used to set the second flexible substrate on the second surface of the substrate.

10. The method for manufacturing the flexible display device as claimed in claim 6, wherein the method for manufacturing the flexible display device further comprises:

forming a driving circuit of the displaying component on the surface of the first flexible substrate that is distant from the substrate.

\* \* \* \* \*